US006593524B1

United States Patent
Toedtman

(10) Patent No.: US 6,593,524 B1
(45) Date of Patent: Jul. 15, 2003

(54) DEVICE AND METHOD FOR PROVIDING EMI/RFI SHIELDING

(76) Inventor: Thomas Toedtman, 3054 Terrace Dr., Aptos, CA (US) 95003

( * ) Notice: Subject to any disclaimer, the term of this patent is extended or adjusted under 35 U.S.C. 154(b) by 0 days.

(21) Appl. No.: 09/914,579
(22) PCT Filed: Jun. 15, 2000
(86) PCT No.: PCT/US00/16772
§ 371 (c)(1),
(2), (4) Date: Aug. 29, 2001
(87) PCT Pub. No.: WO00/79857
PCT Pub. Date: Dec. 28, 2000

(51) Int. Cl.[7] .................................................. H05K 9/00
(52) U.S. Cl. ...................................................... 174/35 R
(58) Field of Search ......................... 174/35 R, 35 GC; 361/818, 816, 800; 257/659, 660

(56) References Cited

U.S. PATENT DOCUMENTS

| | | | |
|---|---|---|---|
| 3,805,356 A | 4/1974 | Serrano | 29/203 B |
| 4,331,285 A | 5/1982 | Gottwals | 228/173 C |
| 4,854,033 A | 8/1989 | Luciani et al. | 29/596 |
| 4,980,223 A | 12/1990 | Nakano et al. | 428/198 |
| 5,045,973 A | 9/1991 | Saarela et al. | 361/395 |
| 5,087,187 A * | 2/1992 | Simkulak et al. | 425/112 |
| 5,191,544 A | 3/1993 | Benck et al. | 364/708 |
| 5,206,796 A | 4/1993 | Thompson et al. | 361/424 |
| 5,239,125 A | 8/1993 | Savage et al. | 174/35 |
| 5,244,708 A | 9/1993 | Tsuchida et al. | 428/77 |
| 5,262,588 A | 11/1993 | Gallagher | 174/35 R |
| 5,294,994 A | 3/1994 | Robinson et al. | 348/825 |
| 5,295,046 A | 3/1994 | Knauber et al. | 361/816 |
| 5,473,111 A | 12/1995 | Hattori et al. | 174/35 R |
| 5,473,507 A | 12/1995 | Schwegler | 361/690 |
| 5,959,244 A | 9/1999 | Mayer | 174/35 GC |

* cited by examiner

Primary Examiner—Hung V. Ngo

(57) ABSTRACT

An EMI/RFI shield, using very thin conductive film (250) for attachment to a plastic part (12), prepared by a process comprising the steps of creating a two dimensional representation of a surface of the plastic part (12) which is to be shielded, creating at least one pattern (254, 256) corresponding to a portion of the representation of the surface to be shielded, incising the patterns (254, 256) into conductive foil material (250) to create foil pattern parts (14, 16), detaching the foil pattern parts (14, 16) from surrounding foil material (60), shaping the foil pattern parts (14, 16) into shaped foil parts (270, 272) and attaching the shaped foil parts (270, 272) to the plastic part (12) by use of an expandable fabricating device (100), which during expansion acts to press the shaped foil part (270, 272) to the plastic part (12). A second preferred embodiment of the present invention (100) is an apparatus for installing thin metallic film (250) shielding with plastic parts (12) to create EMI/RFI shields (10), including an expandable mechanical device (100), which is expandable by activation of at least one device (110, 120) which is operated pneumatically, hydraulically or by solenoid devices.

35 Claims, 14 Drawing Sheets

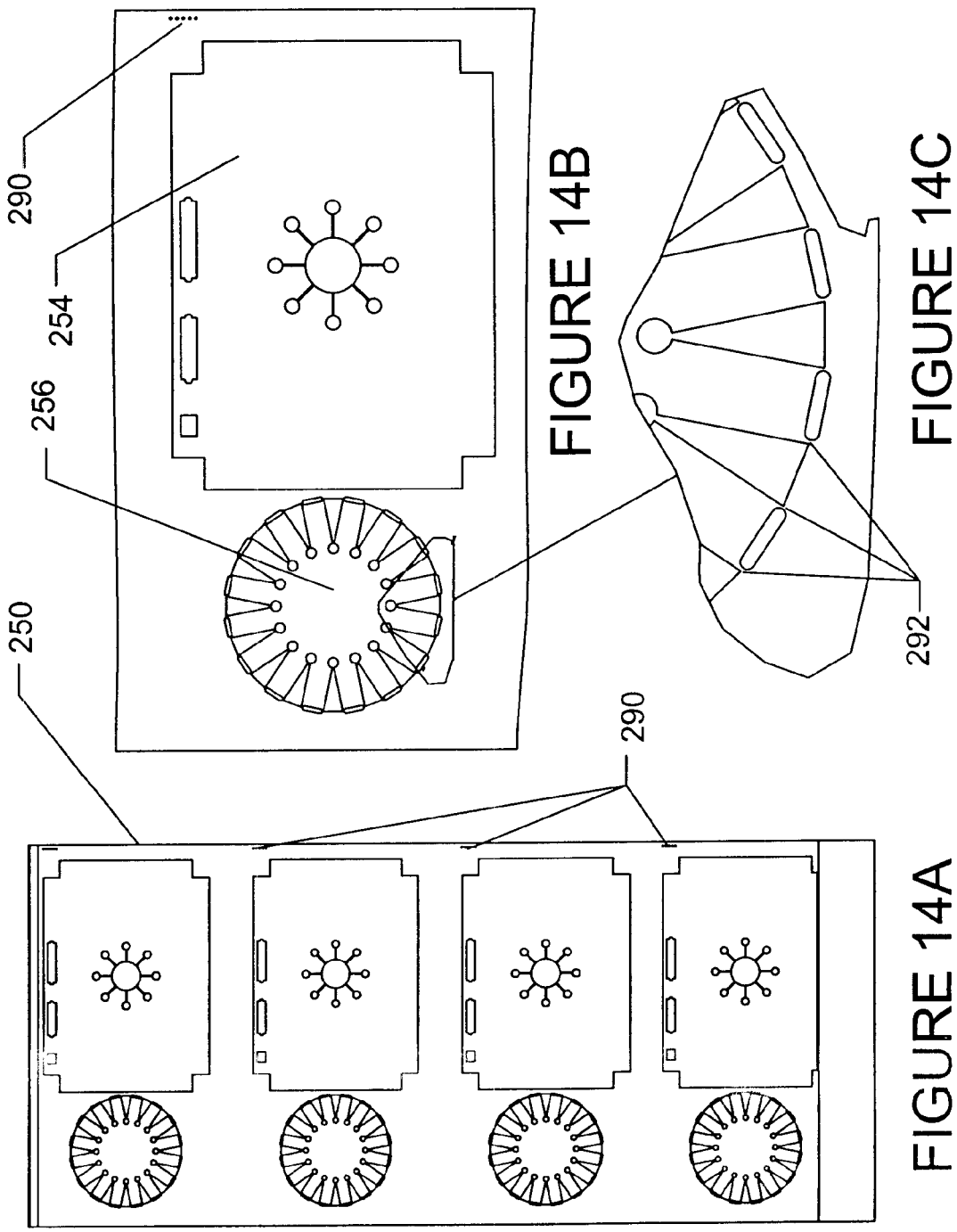

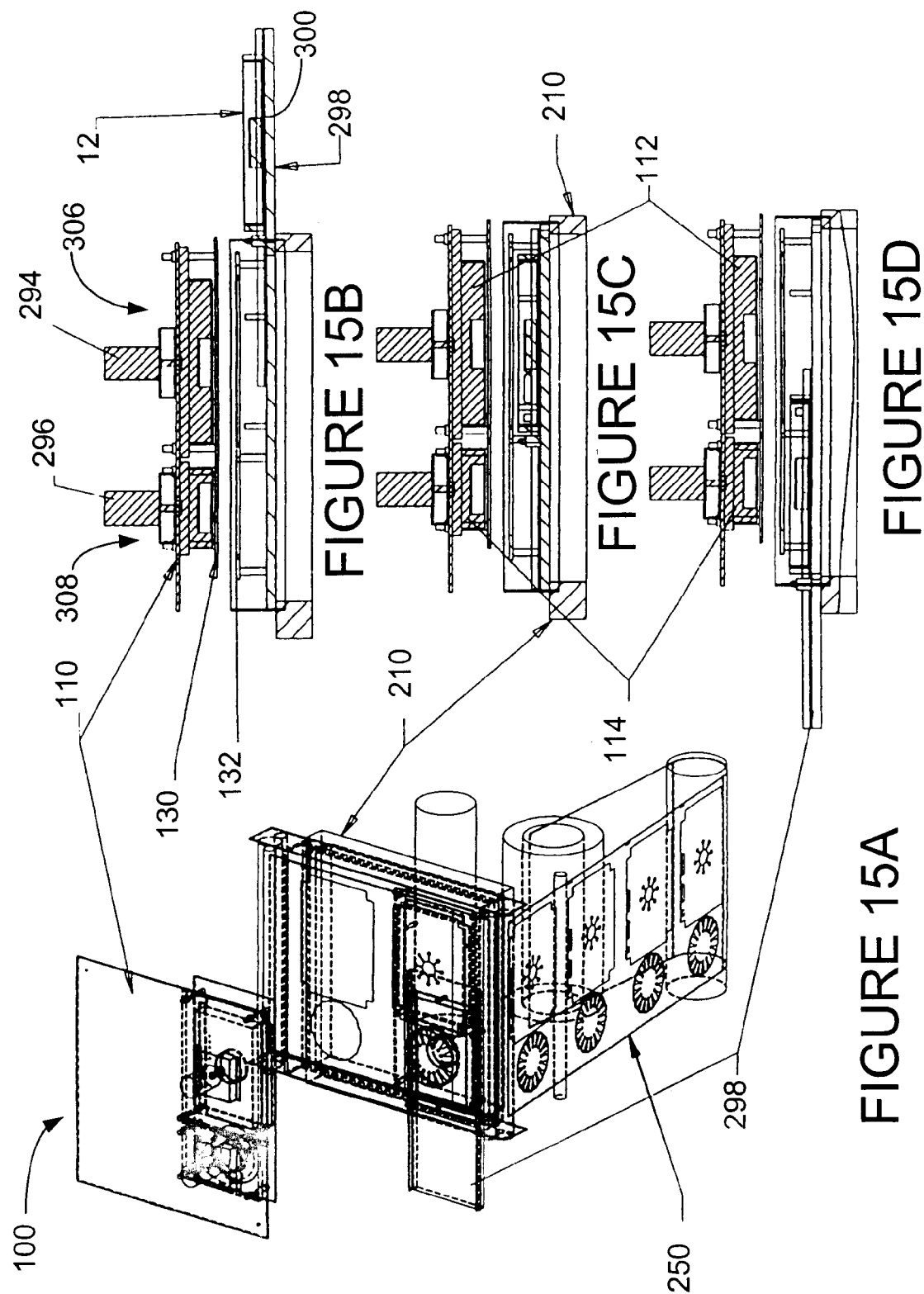

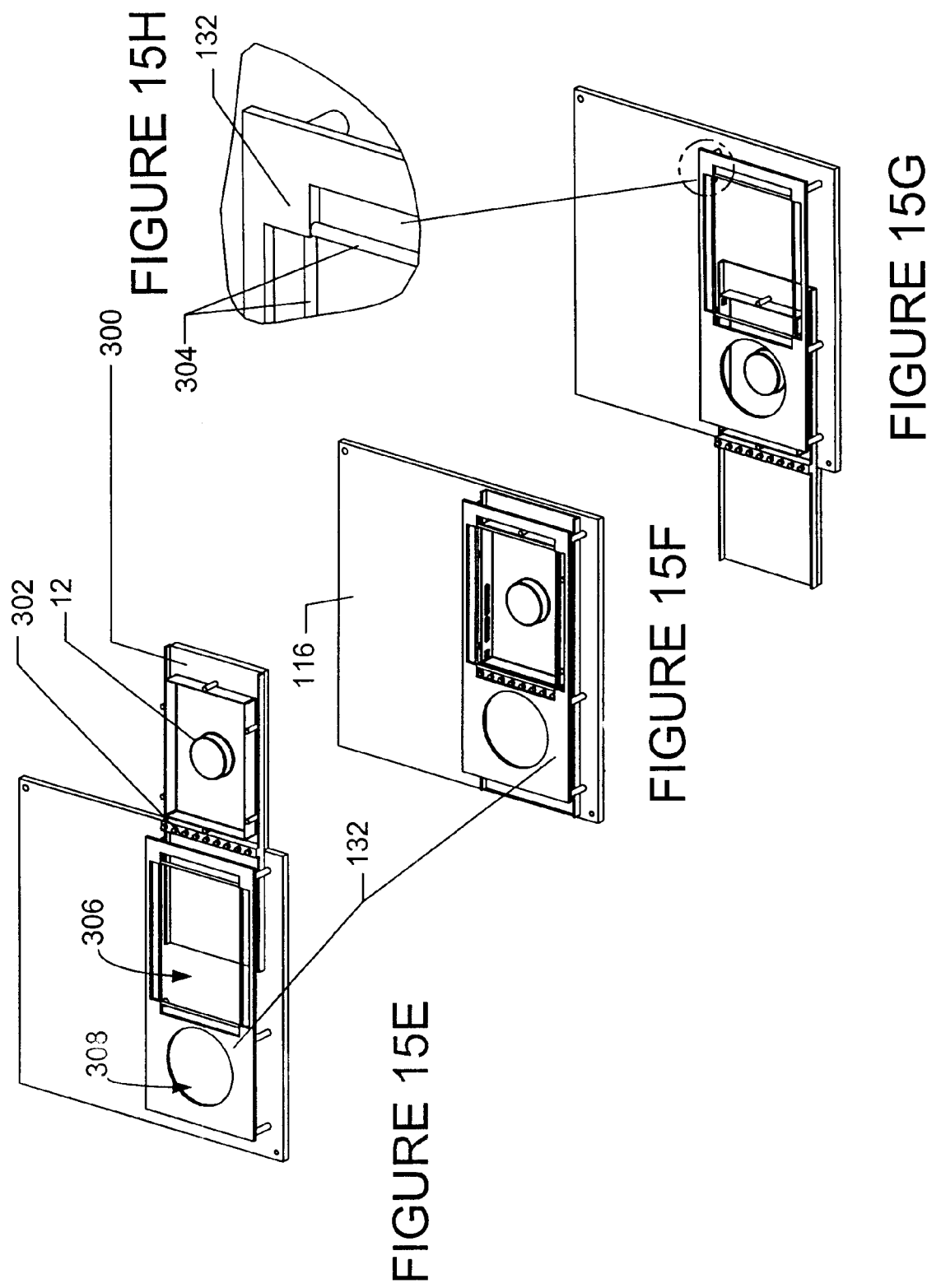

Step 1700 - Starting with a dimensional representation of the interior of the plastic enclosure part 12. One or more 2 dimensional flat patterns 254, 256 are created, and refined to include registration marks 290 and pattern retention features.

Step 1710 - Design and make the male and female shape tools 110, 120 to shape and handle the foil patterns for each flat pattern.

Step 1720 – Design and make the fixture 220 for dispensing a fixative such as adhesive onto the shaped foil parts 270, 272.

Step 1730 - Make the dies of the flat pattern designs and replicate the patterns by incising the patterns 254, 256 into a selected conductive foil material, preferably a continuous roll of material 250 where the foil patterns 254, 256 are partially incised and retained, and then re-rolled.

Step 1740 - Make a nest fixture 280 for retaining the plastic enclosure part 12 during the installation of the shaped foil parts 270, 272.

Step 1750 - Position and connect the tooling onto the equipment or machine.

FIGURE 17

The alternative method (Fig. 15A-15G) utilizes the same first process steps 1700-1750, with the following modification: eliminates the female tool 120, and the fixative application fixture 220, replacing it with a spray system providing a preferably friendly, and easy to clean water based or alcohol adhesive activator in conjunction with a pre-applied adhesive coating.

---

Step 1800 - Position the flat foil patterns 254, 256 and the plastic part 12 onto the equipment. Then move the plastic part 12 into alignment (Fig. 15F) with the first male shape tool 112 while spray nozzles 302 dispense an adhesive activator onto the pre-applied adhesive on the first foil 254.

---

Step 1810 - Advance the first male shape tool 112 to:
First. clamp the foil outside the foil pattern 254 perimeter using outboard skirt 130, 132 then, make contact and grip the foil pattern 254 with the gripping conduit 174; then, further press on the foil pattern 254 to break the retaining tabs 292 and complete the excision of the pattern from the continuous roll.

---

Step 1820 - Next, the first male shape 112 will then partially shape the external side surfaces of the foil pattern 254 into a first shaped foil part 270 by continuing to advance the male shape 112, and the foil pattern 254 through an opening defined by preferably, the internal surfaces of rollers 304 positioned below the first flat foil pattern 254.

---

Step 1830 - Complete the advancement of the first shaped foil part 270 into contact with the plastic part surface, and then release the grip on the foil part (conduits 174 ). Then expand the conduit 170 briefly, to complete pressing the foil part onto other surfaces of the plastic part. Then contract the first male tool shape 112 away from the other surfaces of the foil part and retract the tool, leaving the foil part pressed into the plastic part.

---

Step 1840 - Position the plastic part 12 in alignment with the next (second) male shape 114 and repeating steps 1800-1830 with the next (second) foil pattern 256, and each additional foil pattern until all patterns have been pressed into the plastic part.

---

Step 1850 - Position the complete shielded plastic part to be ejected, and return to step1800.

FIGURE 18

DEVICE AND METHOD FOR PROVIDING EMI/RFI SHIELDING

TECHNICAL FIELD

The present invention relates generally to EMF/RFI shielding for electronic components and more particularly to an improved shielded plastic enclosure part and the methods developed to provide this internal metal shield within a plastic enclosure. These objects are provided by the product of the present invention for providing an automatically shaped and assembled combination of metal foil shielding and plastic enclosure for encasing products needing EMI/RFI shielding.

BACKGROUND ART

Electronic equipment such as computers, printers, cellular phones, and most other products require surrounding shielding that serves to block electromagnetic interference/radio frequency interference (EMI/RFI). This shielding serves three major purposes.

First, various components and circuits of electronic equipment are capable of emitting electromagnetic radiation at a variety of frequencies. In developed countries, which form the most substantial markets for these types of devices, governmental agencies have set maximal acceptable limits for EMI/RFI radiation.

Second, external sources of EMI/RFI radiation can interfere with the functioning of sensitive electronic parts within such devices. Thus, EMI/RFI containment is necessary in order for these devices to perform to commercially acceptable standards. Although some progress in containing the emissions is made by adjustments to the circuits themselves, the requirement for, and use of, grounded conductive surfaces, generally involving the product's normal interior enclosure surfaces, is nearly universal.

Thirdly, grounded conductive interior case surfaces or added shields provide the electronics contained within protection against electrostatic discharge. The same shielding that protects against EMI can serve to provide a grounding path which can protect devices from this electrostatic discharge.

In order to provide shielding with respect to EMI/RFI radiation, a number of different techniques have been used in the prior art. These are commonly based on the completion of a Faraday cage, which provides an adequately grounded conductive part surrounding the electronics. The grounded conductive surfaces reflect and/or absorb the radiated magnetic energy emitted from the electronics, and serve as a barrier to external EMI/RFI, and, as a proximal low resistance path for electrostatic discharges near openings in the product. It is notable that today's higher frequency electronic circuits require only very thin conductive shields for containment.

Products could be simply enclosed by grounded sheet metal fabricated enclosures, however, they are heavy, expensive, and design shape limited. Inexpensive, light-weight, plastic molded enclosures are popular enclosure cases for non-EMI shielding purposes. However plastic, by itself, is not suitable for EMI/RFI shielding, as it is generally not electrically conductive. A workable approach, then, is either to interpose shielding material between the case and the interior components or to incorporate shielding material into the case itself.

A variety of conventional techniques have followed one or the other of these approaches. A common method for providing an interior metal shield within a plastic enclosure is to coat the inside surfaces of the plastic enclosure parts. This can be done by a number of methods. One is painting the surface using metal particle suspensions containing, for example, copper, silver or nickel, by spraying the molded plastic enclosure. Another method is vacuum metalizing, where a metal such as aluminum, is evaporated in a vacuum to form a thin film on the plastic enclosure surfaces. Still another method is electroless plating of the inside surface by metals such as copper followed by nickel. Electroless plating requires adding a catalyst material to the plastic surfaces to be plated, and subsequent immersion in a bath of plating chemicals, rinses, more chemicals, etc. Both the inside and outside surfaces can be plated, but for cosmetic reasons, usually just the inside surface is plated.

All of the coating processes employ semi-automatic or fully automated equipment systems, thus making the process commercially practicable, however, these processes are comparatively expensive in cost per square foot, and suffer from various problems. Some of these problems are: a) loose conductive particles which can short circuits, b) limited connections within particle matrix inhibits high frequency energy flow, c) poor uniformity of coating particles due to variations in coating thickness or conductive particle density, or inadequate deposition in deep cavities.

Another problem is the cost, and the handling involved to pack and transport the plastic parts to a painting or plating facility to receive the coating. Also, one of the major concerns for plating and spray coating processes is both air and water environmental pollution with the metal particles and/or solvents involved in coating application.

An alternative method of providing EMI/RFI shielding to molded plastic enclosures is by filling the molding material with conductive filler such as carbon or aluminum flakes or fibers prior to molding the enclosure. This, however, does not provide a high conductivity, without sacrificing various properties of the plastic. These methods have limitations, which have severely limited their commercial use. Recently, General Electric attempted to pre-form a metal screen (shield) part and automatically install it into the mold and inject the plastic around it.

There have also been attempts to shape metalized plastic substrates by vacuum-forming the substrates to fit into plastic enclosures. This technique relies on heating and stretching the metalized plastic substrate to shape it. Limitations of the technique, and the requirement (cost per square foot) of a stretchable substrate have curtailed popular use of the technique.

Other alternative methods of providing EMI/RFI shielding involve installing separate metal parts, known as shields, inside the plastic enclosures. The shields, which include sheetmetal, laminated foils, metalized plastic films, metalized fibers, and basic stamped sheet-metal shields. All of these materials have design and economic drawbacks. Laminated foils, such as aluminum/mylar are tenfold the price of just aluminum foil and are installed manually. This manual handling, shipping and installing also limits how delicate a part can be, and the amount of fine detail in the laminated part design. However, simple pre-manufactured shields are easily die cut and growing in popularity. Other drawbacks become evident in the packaging, shipping, and handling which can be a source of defects. Stamped metal shields are heavier gage metal, easily distorted due to handling and can contain sharp edges, which can injure someone working with it. Also, besides the weight, heavier gage metals require punch & die tooling, which takes more time and money to make.

Therefore there is a need for effective EMI/RFI shielding which has no loose conductive particles, provides good conductive paths with uniform thickness, which can be produced by automated manufacture and is inexpensive to produce. There is also a need for a device which can install such shielding in an efficient and automated fashion of layers which are so very thin that manual installation may not be practical. There is a further need for a system which incorporates such an installation device and which automates the entire process to produce shielded parts in an automated fashion.

DISCLOSURE OF INVENTION

Accordingly, it is an object of the present invention to provide an improved EMI/RFI shielded plastic enclosure, which provides good conductive paths for EMI/RFI and electro-static discharge.

Another object of the invention is to provide effective EMI/RFI shielding which is of uniform thickness and has no lose conductive particles.

A further object of the present invention is to provide an EMI/RFI shielded plastic enclosure which can be produced for very intricate and delicate forms by machine automated processes.

A yet further object of the present invention is to provide an EMI/RFI shielded plastic enclosure wherein the thickness of a pre-manufactured conductive material part can be reduced to levels heretofore not practical or possible, due to the previous limitations of manual handling, packaging, and installing of an added part.

Still another object of the present invention is to provide an EMI/RFI shielded plastic enclosure wherein the surface conductivity and superior EMI performance of metal foil is made commercially possible without the costly plastic or fiber backing of the laminated materials.

An additional object of the present invention is to provide a system for producing EMI/RFI shielded plastic enclosures wherein the shaping of 2 dimensional flat foil parts into a 3 dimensional foil parts is accomplished by tooling which is also used to install the foil parts into the plastic parts.

Another object of the present invention is to provide a system for producing EMI/RFI shielded plastic enclosures wherein the tooling used to shape and install the foil parts is capable of gripping the foils, and also expanding and contracting specific tool features with the foil part thereon.

It is a further object of this invention to provide an improved EMI/RFI shielded plastic enclosure wherein the foil pattern is presented to the tooling as partially incised on a continuous roll of foil patterns, and the tooling used to shape the foil also contains the mechanism to separate the foil from the continuous roll of foil parts.

Briefly, one preferred embodiment of the present invention is an EMI/RFI shield, using very thin conductive film for attachment to a plastic part, prepared by a process comprising the steps of creating a two dimensional representation of a surface of a plastic part which is to be shielded, creating a pattern corresponding to a portion of the representation of the surface to be shielded, incising the pattern into conductive foil material to create a foil pattern part, detaching the foil pattern part from surrounding foil material, shaping the foil pattern part into a shaped foil part and attaching the shaped foil part to the plastic part by use of an expandable fabricating device, which during expansion acts to press the shaped foil part to the plastic part.

A second preferred embodiment of the present invention is an apparatus for installing thin metallic film shielding in plastic parts to create EMI/RFI shields, including an expandable mechanical device, which is expandable by activation of at least one device which is operated pneumatically, hydraulically or by solenoid devices.

A method of manufacture is also disclosed for creating EMI/RFI shields.

An advantage of the present invention is that the forming and mating of the foil part to the plastic part is accomplished by a machine automated method.

Another advantage of the invention is that the cost of the material (per square foot) and the total cost of installing, development time, tooling, parts transportation, performance, reliability, and capital investment is reduced in comparison to coatings and plating.

And, another advantage of the invention is that an option is provided to later remove the conductive material from the plastic part of the improved EMI/RFI shielded plastic enclosure, for recycling.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended drawings in which:

FIGS. 14A–C are detail views of a roll of foil and enlargements showing registration marks and retaining tabs;

FIG. 15A is a reduced isometric view of an arrangement of equipment for an alternate one-station embodiment with a plastic part shuttle plate and no female shape tool;

FIGS. 15B–D are cross sectional views of the male shape tools and the plastic part shuttle for the alternate one-station embodiment;

FIGS. 15E–H are isometric views of a one-station embodiment with a plastic part shuttle assembly;

FIG. 17 is a chart showing the steps of designing and preparing foil patterns and creating flat foils for shaping and installation into a production plastic part; and FIG. 18 is a chart showing the steps of creating a foil lined production plastic part.

BEST MODE FOR CARRYING OUT THE INVENTION

Figure 1:
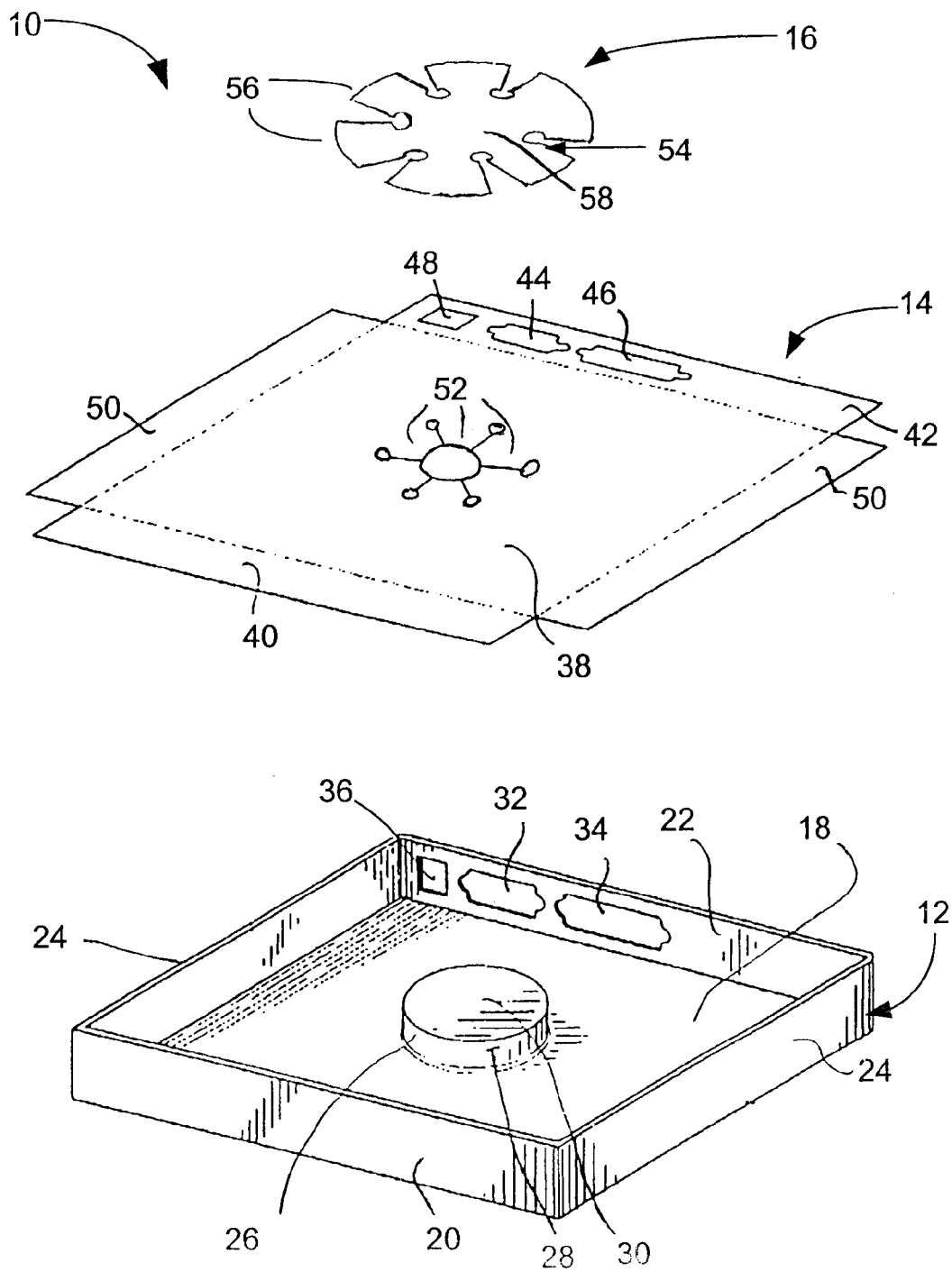
FIG. 1 is an exploded perspective view of an EMI/RFI shield.

A preferred embodiment of the present invention is a device for providing improved EMI/RFI shielding made by the process disclosed below. As illustrated in the various drawings herein, and particularly in the view of FIG. 1, a form of this preferred embodiment of the inventive device is depicted by the general reference character 10. It is to be understood that the shield shown represents the shape of a shield only generally, and that many other sizes, shapes and configurations of shields are possible.

FIG. 1 shows a generalized EMI/RFI shield 10 in exploded view, prior to assembly. A plastic part 12 is covered with a first flat foil 14 and a second flat foil 16. The product shield 10 is produced by the novel process and system to be described below.

Referring further now to FIG. 1, plastic part 12 is a molded production plastic part of the general type that is manufactured for the containment of electronic equipment such as computers and their peripherals, cellular telephones, radios, etc. The plastic part 12 is intended to comprise half of the container for an item of electronic equipment, joining together with a second half (not shown) to form a closed container which will completely (or partially) encase the internal electronic parts. Plastic part 12 consists of a rectangular floor 18, a rectangular back panel 20, a rectangular front panel 22 and rectangular side panels 24. Protruding upwardly in the center of floor 18 is a circular protrusion 26 having cylindrical sidewalls 28 and circular top 30. Front panel 22 has incised therein three cutouts, small cutout 32, large cutout 34 and square cutout 36. Through these cutouts 32, 34, 36 communication with the exterior may be had. For example an exterior control panel with various dials and switches (not shown) may communicate through cutout 34 while a plate containing interconnections (not shown) for attachment of cables may be found in cutout 32. Likewise a status information device such as a light (not shown) may occupy cutout 36.

It is desired to cover all the interior surfaces of plastic part 12 with at least one layer of metal foil such as aluminum foil in order to provide adequate shielding so as to block electromagnetic interference/radio frequency interference (EMI/RFI). It is not desired to provide shielding over cutouts 32, 34, 36 since these cutouts serve as pathways to the exterior of the electronic device. To this end, the surfaces which must be covered consist of floor 18, back panel 20, front panel 22 (except for cutouts), side panels 24, side walls 28 and top 30. For volume production of this covering it is desired that the foil to cover the interior surfaces of plastic part 12 be preferably die cut from a continuous roll of metal foil. In order to accomplish coverage of all the desired interior surfaces of the plastic part 12 with flat foil, it is necessary, in almost all cases, to use more than one layer of foil. (Although in extremely simple cases, such as where the central protrusion of FIG. 1 is not found, a single layer of foil may suffice).

The first flat foil 14 is preferably a single die cut foil. It can be seen that the first flat foil 16 will, when shaped, cover substantially most of the interior of plastic part 12. Central rectangle 38 will cover rectangular floor 18 and top rectangle 40 will cover rectangular back panel 20. Likewise bottom rectangle 42 will cover rectangular front panel 22, with cutouts 44, 46, 48 corresponding to small cutout 32, large cutout 34 and square cutout 36 respectively. Rectangular sides 50 cover rectangular side panels 24. In the center of central rectangle 38 is a circular repetition of a tab pattern 52 protruding inwardly. When tab patterns 52 are bent upwardly at an angle of about 90 degrees, they will partially cover sidewalls 28.

The second flat foil 16, is, in this instance, circular in shape to match the circular protrusion 26 of the plastic part 12. Incised into the circle are cutouts 54 which extend radially outward a predetermined distance thereby providing a pattern of teeth 56 extending radially outward. Thus a disk center 58 remains unincised.

Figure 2:
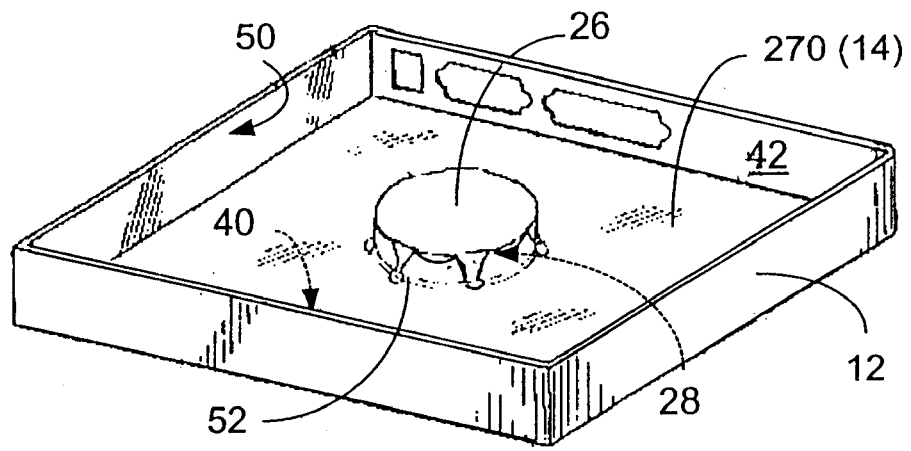
FIG. 2 is a perspective view of a plastic part having the first shaped foil installed therein.

FIG. 2 shows the plastic part with the first flat foil 14 already shaped and installed. The rectangular panels 40, 42, 50 were shaped 90 degrees into vertical wall panels. The circular tab patterns 52 were also shaped upward 90 degrees, which are installed and pressed against the cylindrical wall 28 of the circular protrusion 26. To distinguish the shaped first and second foil parts from the unshaped flat foil parts 14, 16, the first and second shaped foil parts will be designated as 270 and 272 respectively. The process by which they are shaped is described in some detail below.

Figure 3:
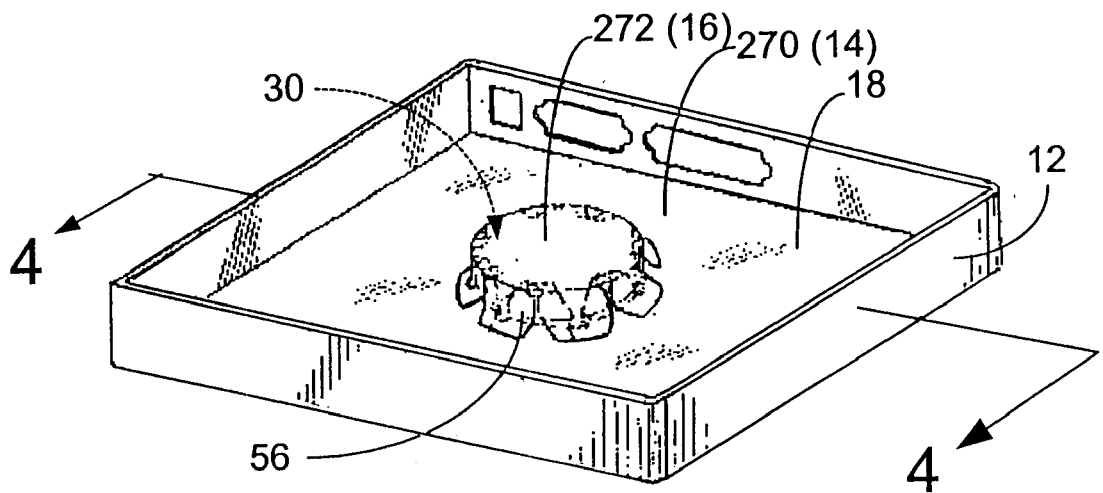
FIG. 3 is a perspective view of a plastic part having both the first shaped foil and second shaped foil installed therein.

FIG. 3 shows the next stage of assembly, with the second flat foil 16, shaped into the second shaped foil 272 installed on the top 30 of the circular protrusion 26. It can be seen how the teeth 56 of the second shaped foil 272 are bent down to cover any gaps left by the tab pattern of the first shaped foil 270. The teeth 56 may be long enough to also extend outwardly in a radial pattern on the surface of the rectangular floor 18.

Figure 4:
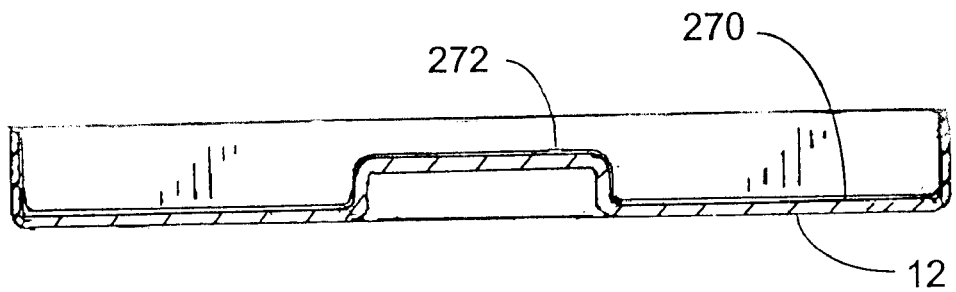
FIG. 4 is a cross-sectional view of FIG. 3, taken along the line 4—4.

FIG. 4 is a cross-sectional view of FIG. 3, showing the second shaped foil 272 layer, the first shaped foil 270 layer and the underlying plastic part 12.

Figure 5:
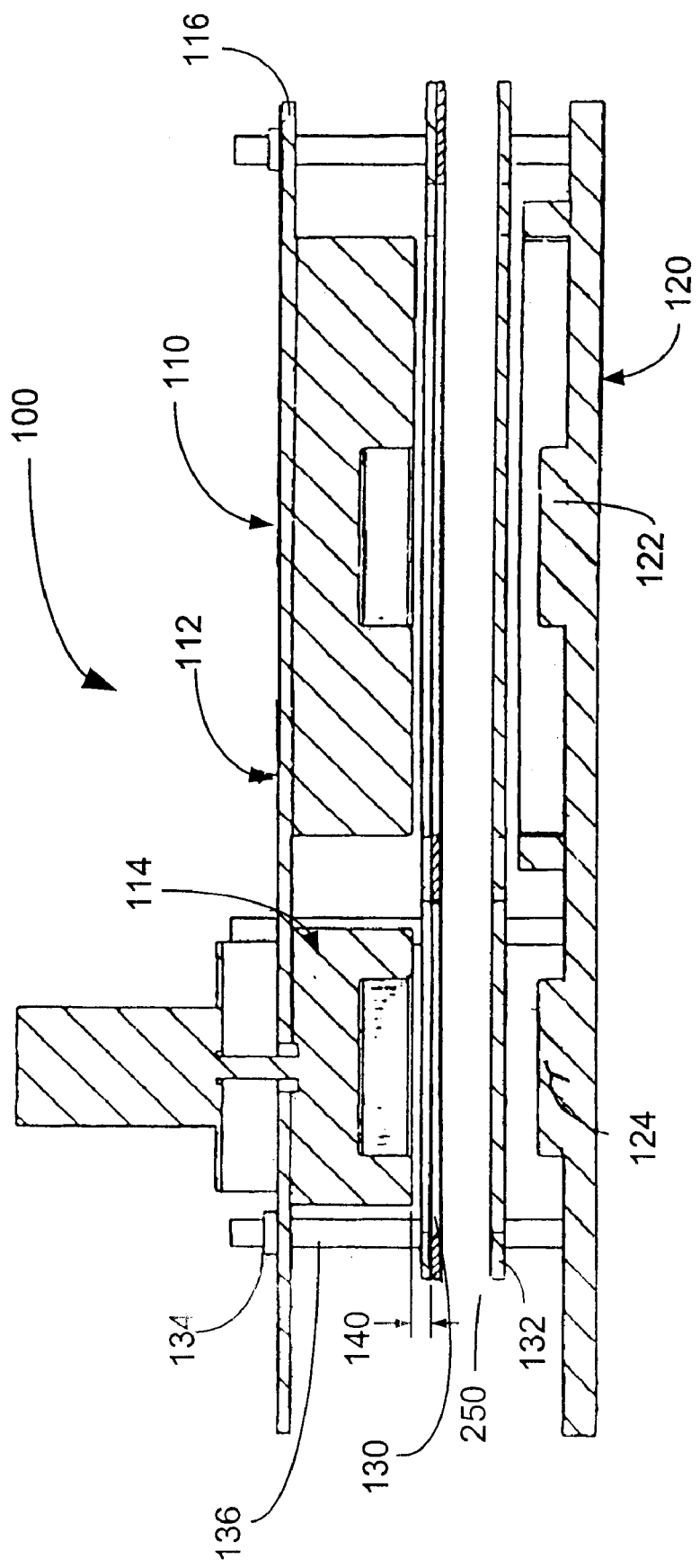
FIG. 5 is a cross sectional view of the first and second male and female tools with outboard skirts.

The use of metal foils in conjunction with a plastic part in order to create an EMI/RFI shield is not new, as has been discussed in the Background Art section. However, the device and process for installing these foils is new and allows for use of foils of thinness and delicacy which were not practical by manual installation methods. This allows for cost savings on these metal foils, which can be significant. Also significant is the time and labor savings when an automated device and system is used to install the foils. One preferred embodiment of the device used for such installation is illustrated in FIG. 5 and is referred to by element number 100. A male shaping tool 110 consists of a first shape tool 112 and a second shape tool 114 assembled to a common tooling plate 116. Both shape tool 112 and 114 can be constructed of an elastic material such as silicone rubber by a industry common casting method that is able to mirror replicate all of the interior details of plastic part 12. An industry common method of attaching these shapes to the plate such as screws would be used. A female shaping tool 120 with a first tool shape 122 and a secondary tool shape 124, replicate the interior contours of the plastic part 12. An actual plastic part 12, in some cases, may be used as the female tool. A copy of the interior contours of the plastic part 12 can also be machined or otherwise re-produced in metal or any desirable material to construct the first female tool shape 122 and second female tool shape 124.

Included with the male shaping tool 110 is a male outboard skirt 130, and female shaping tools 120 includes a female outboard skirt 132, both of which are constructed from plates with internal cutouts matching the perimeter of the incised patterns 52, 54 of the first flat foil 14 and second flat foil 16. The female outboard skirt 132 is fixed in elevation on the female tool 120 just below a section of uncut foil 250. The male outboard skirt 130 is mounted to vertically retractable shafts 134 on the male tool 110, with springs (not shown) providing a downward force. Clamps 136 on the shafts, limit the downward travel of the skirt 130 but do not prevent the upward travel of this skirt. The skirt 130 is positioned just above the foil 60, and some distance 140 below the male shaping tool 110. A thin flexible material such as polyurethane would be attached to skirt 130, to uniformly clamp the foil 250 between the outboard skirts 130, 132.

A desired capability of the male tool shapes 112, 114 is to expand and contract the vertical surfaces of the tool shape, primarily laterally. Contracting the tool shape enables the male tool shape to enter or exit the female tool or the plastic part with less side wall contact. Expanding the male tool shape presses the surfaces of the male tool shape against the interior surfaces of the female tool or the plastic part. An elastic material will expand laterally when vertically compressed, and contract again when the compressive force is removed. Partially segmenting the cast benefits this technique.

Figure 6:
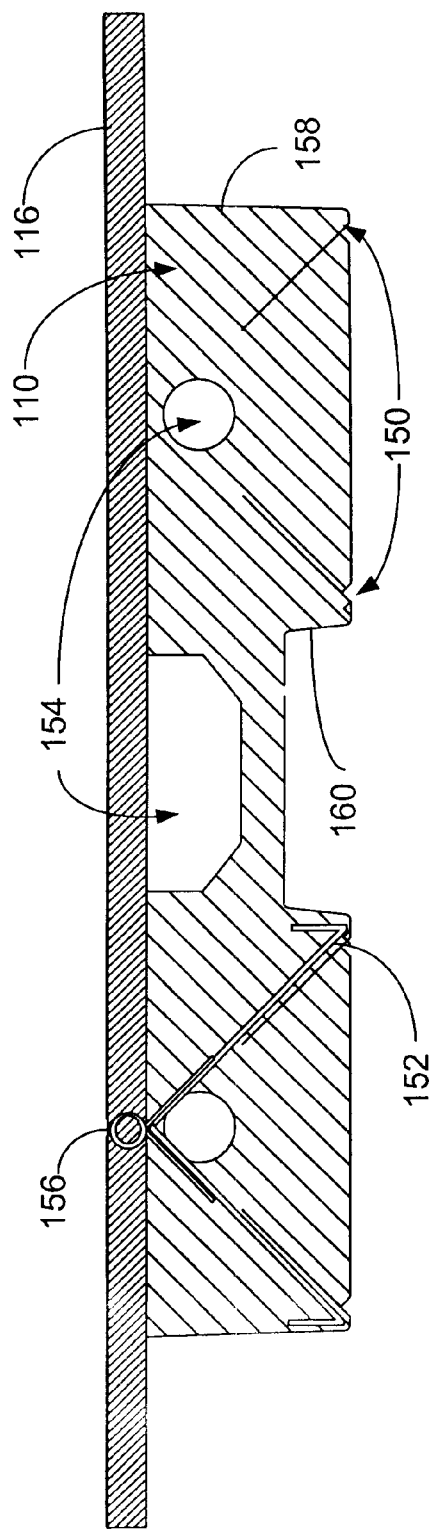
FIG. 6 is a cross-sectional view of one partially segmented male tool shape contracted.
Figure 7:
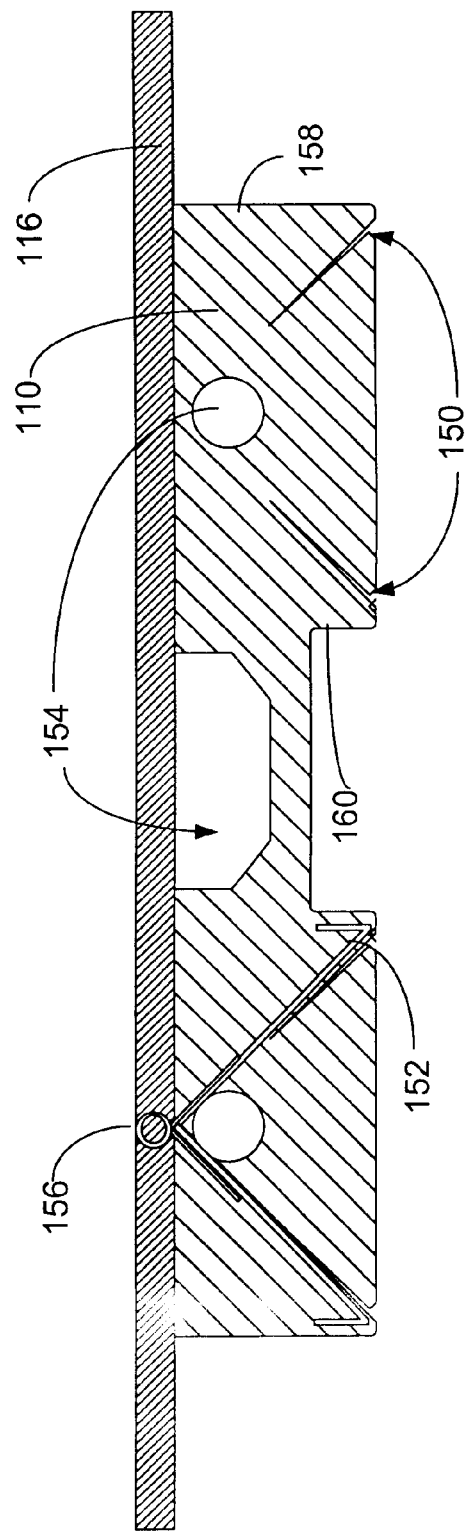
FIG. 7 is a cross-sectional view of the partially segmented male tool shape of FIG. 6 expanded.

FIGS. 6 and 7 show a cross-section of a male shaping tool 110 mounted on a tooling plate 116 in which the cast has been segmented. FIG. 6 shows the tool in contracted position and FIG. 7 shows it in expanded position. The lateral stress in the tool material is reduced when vertically compressed by enabling sliding movement between the segment cuts 150. The lateral movement can be somewhat directed as in this figure a progressively greater lateral movement will now be nearest the bottom surface of the tool. Also stiffening elements 152 in some segments and voids 154 or other easily compressible elements in other segments add additional control of the lateral movements. A spring element 156 is added to insure reliable contraction of the segments. The spring and stiffener were deleted from the right side of the illustrations for clarity. The changes from the contracted tool shape in FIG. 6 to the expanded tool shape in FIG. 7 illustrate the lateral expansion of the outer perimeter walls 158 and the inner expansion of the inner tool walls 160 towards the center of the tool. The expanded condition (FIG. 7) is caused by vertically compressing and distorting the tool shape against a rigid surface such as the floor surface of the plastic part (not shown). Removing this vertical pressure would enable the male tool shape to return to its normal contracted shape (FIG. 6). This technique could be employed for some designs including the shield illustrated in the earlier figures, however, other techniques can also be employed to laterally expand and contract the male shaping tool 110 contours, as will be discussed below.

Figure 8:
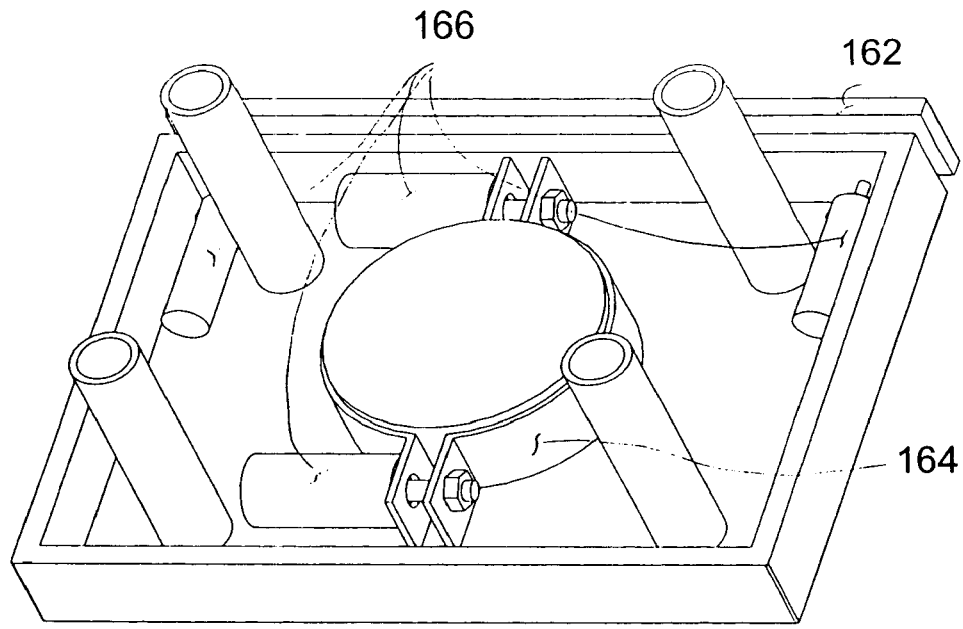
FIG. 8 is an inside isometric view of a male tool shape with air cylinder actuators.

FIG. 8 shows another method of controlling expansion and contraction of the male shaping tool. The addition of separate walls 162, or an adjustable ring element 164, that expand or contract by actuating air cylinders, hydraulic cylinders, or solenoids 166 connected to these moveable elements is possible.

Figure 9:
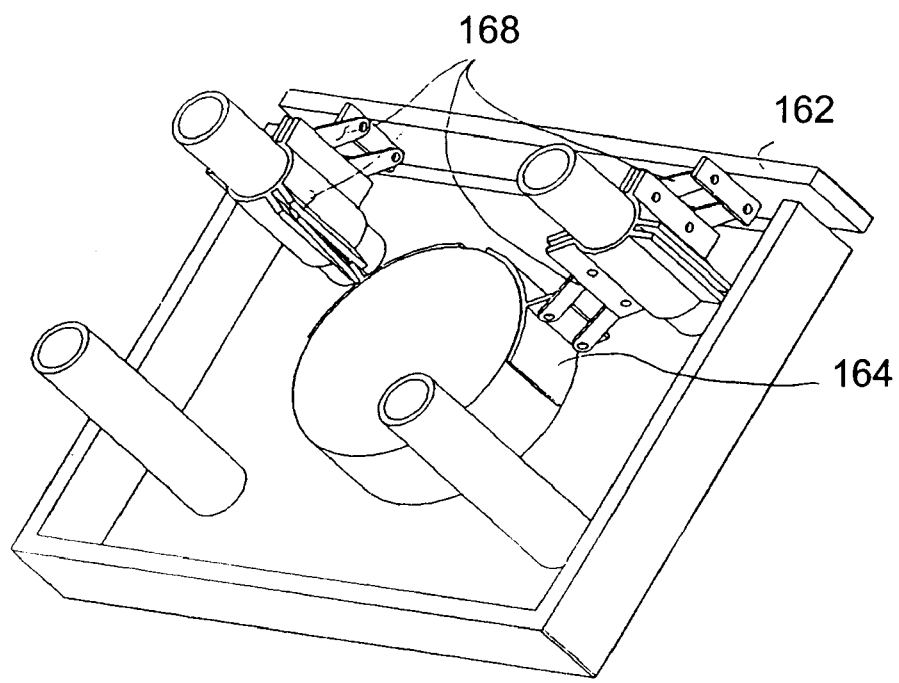
FIG. 9 is an inside isometric view of a male tool shape with linkage actuators.

In FIG. 9, adding mechanical linkages 168 with springs (not shown), which convert the vertical movement of the tool, to also produce a lateral movement of the inner and outer side wall surfaces of the tool shape is yet another method. The lateral expanding movement of the mechanical linkage works in the same way as the stiffeners 152 in the segmented tool shape (FIG. 7). When the tool shape stops its downward travel by coming in contact with a rigid element such as the floor of the female tool or the plastic part, further downward travel of the mechanical linkages 168 produce lateral expanding movements of the wall 162 and ring segments 164 attached to the linkages. As the vertical movement is reversed, the mechanical linkages 168 return to the retracted position with the aid of springs (not shown) before the tool shape begins to withdraw.

Figure 10:
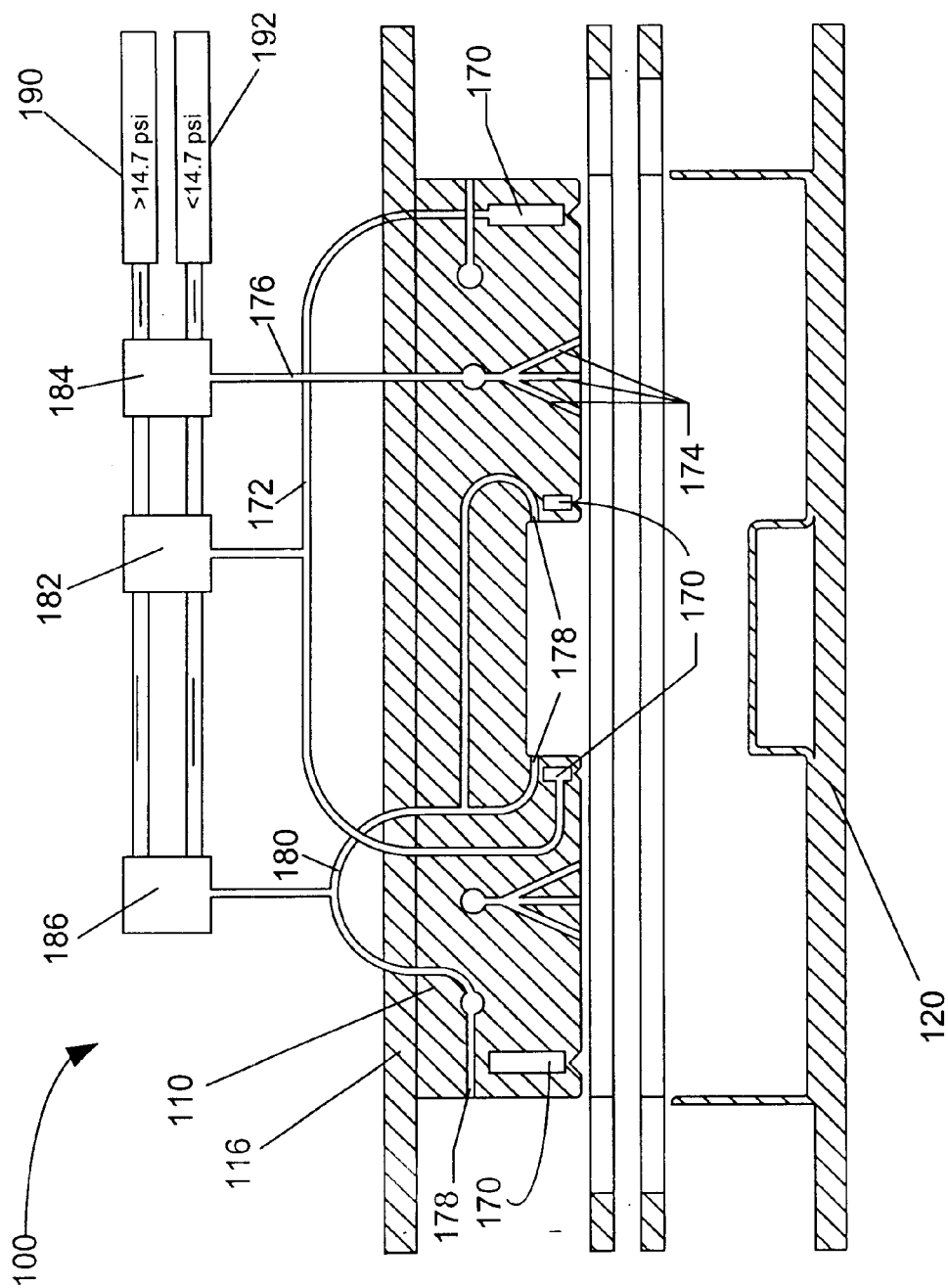
FIG. 10 is a cross sectional view of a fabrication device including one male tool shape and one female tool shape, showing one configuration of gripping and expanding air conduits of the male tool shape, together with a typical air supply configuration.

Still another method is to controllably expand or contract hollow conduits cast within the tool shape. FIG. 10 shows a sectional view of the male shaping tool 110 having hollow channels or expanding conduits 170 shown inside the cast tool. The expanding conduits 170 are constructed of a removable material (wax for example) inside a sample or replica of the plastic part 12. A casting of the inside of plastic part 12, with the conduits constructed therein, is made, then the conduit material is removed (with heat for example) leaving the hollow conduit patterns in the tool. The male shaping tool 110, shown above female tool 120, will contain various conduits connected through tubing and fittings to controlled solenoid valves 182, 184, 186, and then to sources of air pressure greater than 190, and less than 192, atmospheric pressure using common hardware, solenoid valves, and air supply pumps. Either manual or automatic actuation of the valves can be utilized. Expanding conduits 170 are interconnected via a first master conduit 172 and further connected to a first control valve 182. The expanding conduits 170 may be dedicated to expanding and contracting specific areas of the first male shape 112 contours. Gripping conduits 174 may be dedicated to gripping the first foil pattern, and are connected by a second master conduit 176 to a second solenoid valve 184. Also, additional foil gripping conduits 178 are interconnected via third master conduit 180 and then to third valve 186. In a similar manner, the secondary male shape may include gripping conduits grip the secondary foil pattern, and expanding conduits are dedicated to expanding and contracting the internal cylindrical wall.

Grooves in the male shaping tool provide a defined location to absorb the expanding and contracting movements in the tools and the foil thereon. For the plastic part 12 shown earlier, an additional groove may be added around the circular protrusion.

Figures 11, 12:
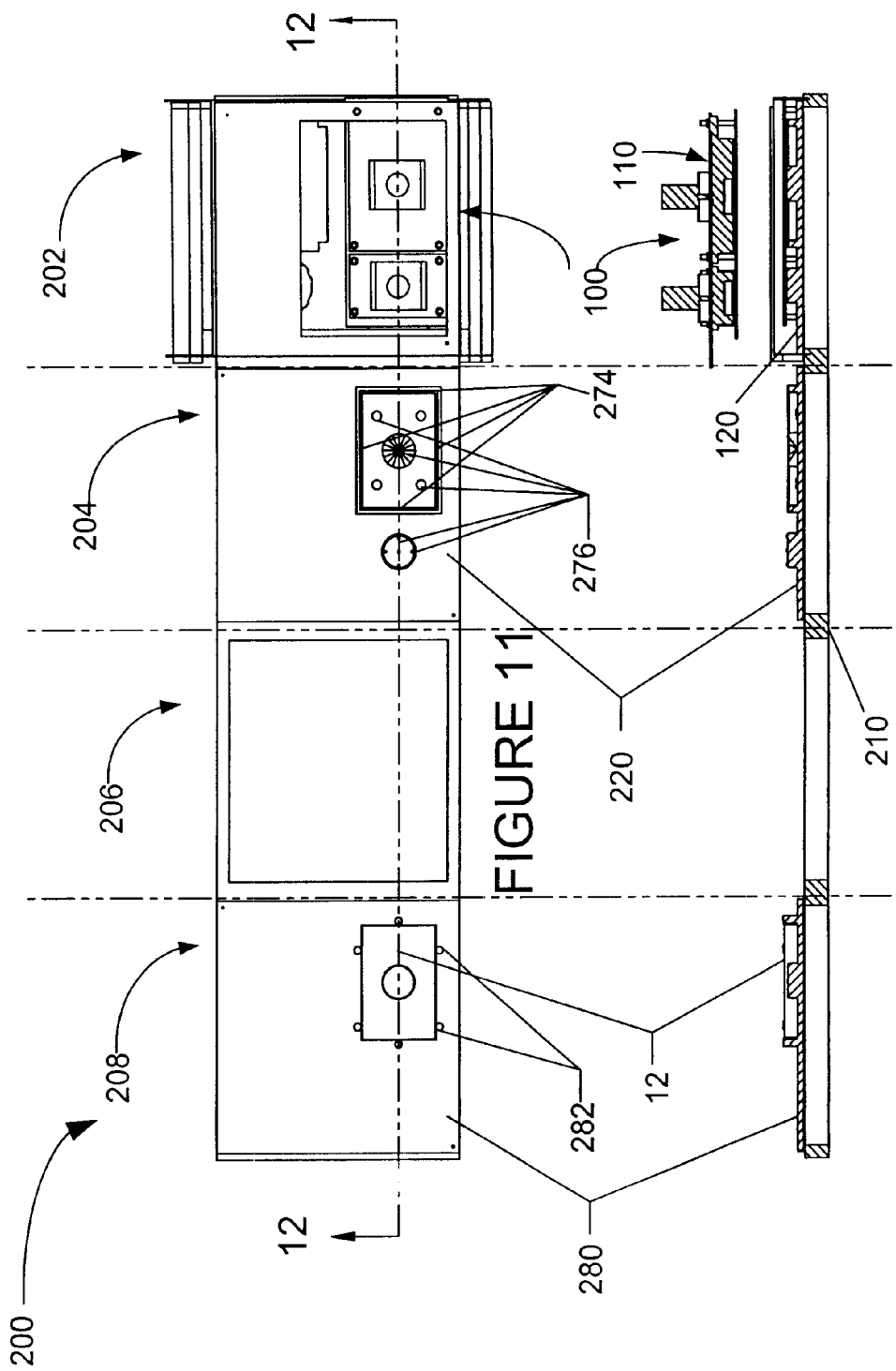
FIG. 11 is a overhead plan view of a linear configuration of a fabrication device in a fabrication system including four processing stations.
FIG. 12 is a cross-sectional view of the fabrication system of FIG. 11, taken through line 12—12.
Figure 13:
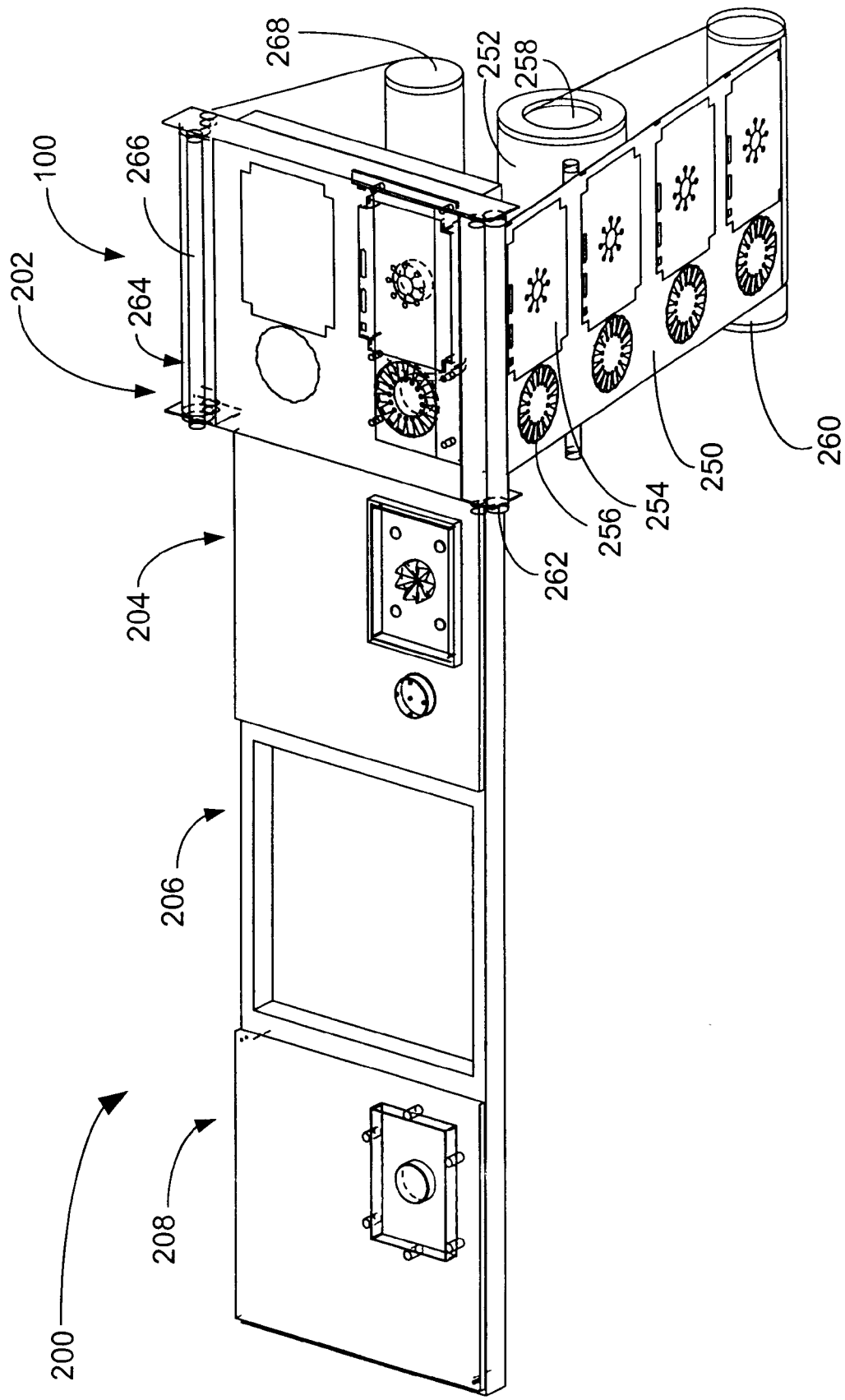
FIG. 13 is a perspective view of a fabrication system including a continuous roll of metal foil having multiple die patterns partially incised therein.

The fabricating device 100 including male shaping tool 110 described above may be included in a larger overall system for producing EMI/RFI shields 10. FIGS. 11–13 show such a system 200 in which four processing stations or positions are designated as station one 202, station two 204, station three 206 and station four 208. Fabricating device 100 operates on the processing stations 202–208 in ascending numerical order, and in the figures, proceeds from right to left. The fabricating device 100 may be designed to travel along rails or similar mechanisms to stop at each station 202–208 in turn, or the fabricating device may be fixed while the "stations" are located on a moving bed so that each station in turn is positioned beneath the fabricating device. In the first preferred embodiment discussed, it will be assumed that the fabricating device travels and the stations are stationary.

A partial frame 210 is shown describing a straight-line sequence whereon at station one 202, the foil patterns are fed and aligned, and the male and female shaping tools cooperate to shape the foil patterns into foil parts. The fixative application fixture 220 is shown in station two 204, and station three 206 is not active, but could provide additional foil patterns for example. Station four 208 locates the nest which locate the plastic part. Various items are not shown for clarity are the male shaping tool, the actual supporting structure, the air pumps, tubing, wires, motors, sensors, dispenser mechanism, the controller, and the male tool shuttle. The male tool shuttle provides for the mounting of the male tool and in cooperation with frame rails (not shown) provides the mechanism of repositioning and locating the male tooling to each position.

In FIG. 12, station one 202 includes the fabricating device 100 which is shown with mechanisms to allow automatic feeding of metal foil from a continuous roll. FIG. 11 and particularly FIG. 13, show a basic roller arrangement for automatic feeding a continuous foil material 250 through the process. A roll 252 of continuously incised first foil patterns 254 and second foil patterns 256 is mounted on a powered mandrel 258 (motor not shown). The foil material 250 is fed down to an idler roller 260 shown in a down position, The foil material 250 continues up and through the front idler rollers 262, then across station one and through the primary drive 264 (motor not shown) and pinch rollers 266. The excess foil material can be fed down to a rear take up roller 268.

FIG. 14A–C show detail views of the foil 250 and the first and second incised patterns 254, 256. FIG. 14A shows a length of the continuous foil material 250 and registration marks 290. FIG. 14B shows a single section of this material with the first 254 and second 256 foil patterns and registration marks 290. FIG. 14C is a detail view of a portion of the second foil pattern 256, showing retaining tabs 292.

Returning now to FIGS. 11–13, when a signal to advance the foil patterns is given, the primary drive roller 264 in conjunction with the foil pinch rollers 266 starts, and the foil material 250 is advanced across position one 202, until the next set of registration marks 290 (FIG. 14A) begins to trigger the registration sensors (not shown). The registration sensors then send signals to the controller which in turn sends signals to the primary drive roller motor 264; first to slow down, and then to stop precisely on a signal. During this foil feed cycle, the light weight idler roller 260 rises as the foil advances, which causes a signal to the controller from idler position sensor or switch (not shown) to start the powered mandrel 258. As the powered mandrel 258 rotates the roll 252 and releases foil material 250, the idler roller 260 will lower back down, tripping an idler position sensor (not shown) and causing the powered mandrel 258 to stop.

Commonly, successive layers of shaped foil must be installed. As shown in FIGS. 15A–D, as well as FIGS. 11–14, assembly is begun with a new plastic part 12 being set into a nest 280 in station four 208. The roll of metallic foil 252 is placed in position in station one 202, and advanced until alignment of the registration marks 290 with the equipment sensors is achieved whereupon the first and second foil patterns 254, 256 are aligned with the composite male tool 110. The specially designed male tool 110 includes a first male shape tool 112 and a second male shape tool 114, and there are corresponding female first and second shape tools 122 and 124. In a single downward motion, the male tool 110 first clamps the foil material 250 just outside the patterns, then contacts and grips the flat foil patterns 254, 256 between the outboard skirts 130, 132, then contacts and grips the foil patterns 254, 256 utilizing circuits 174, then completes excision of the flat patterns 254, 256 from the roll of foil patterns 252 by breaking the retaining tabs 292. As the male tool shapes 112 and 114 enter the female tool shapes 122, 124, the foil patterns 254, 256 fold and conform to the female tool shapes 122, 124. The shaped foil parts 270, 272, retained on the male tool shapes 112, 114, are then repositioned, and treated with adhesive at station two 204. The male tool 110 is repositioned, and installs the second shaped metal foil 272 into the plastic part 12 in station four 208, to which it will adhere, and withdraws. Then the male tool 110 repositions and inserts the first shaped metal foil 270 into the plastic part 12, to which it will adhere, and withdraws. The male tool 110 would then return to the first station 202, and the finished plastic part 12 is removed.

It is also possible that the shaping of both the first flat foil 254 and second flat foil 256 can be accomplished simultaneously in station one 202. In FIG. 5 and FIG. 12, the male tool 110 starts just above the foil patterns, and the female tool 120 is fixed just below the foil patterns 254, and 256. When actuated, the male tool 110 moves downward and the male outboard skirt 130 contacts the foil material 250 just outside the patterns 254 and 256, clamping it firmly to the female outboard skirt 132. Further downward travel causes the bottom surfaces of the first and second male shapes 112, 114 to contact the foil patterns 254, 256, whereupon the gripping circuits 174, 178 (see also FIG. 10) connected to low pressure 192, grip the flat foil surfaces. Further downward travel of the male tooling pushing on the foil patterns causes the retaining tabs 292 on the foil patterns 254, 256 to break, thus excising the foil pattern from the roll 252 of foil patterns. Further yet downward travel engages the male tool 110 into the female tool 120 folding, bending, or otherwise forcing the foil to conform to the space between the male and corresponding female tool surfaces, thereby shaping the foil into both the first and second shaped foil parts 270, 272.

Referring again now also to FIG. 10, when the male tool 110 is fully engaged in the female tool 120, conduits 170 would be expanded briefly to press the foil parts 270, 272 against the inner surfaces of the female tool 120, and the additional gripping conduit 178 would be connected to low pressure source 192, gripping the shaped foil surfaces. Next, the conduits 170 are contracted (connected to low pressure source 192) to aid in the release of the foil part from the female tool. Excess foil material may gather in grooves provided for this purpose.

The same technique is also applicable to shaping the circular tab patterns 52 against cylindrical side walls 28 of the plastic part 12, and to the secondary foil part 16 shaping where conduits are alternately expanded and then contracted to shape the foil teeth 56 against the surfaces of the second female shape 124. Also, although only the male tool 110 is shown as having movement, it is possible, in cases where complex manipulations are required, to also provide the female tool 120 with similar properties of flexibility, cavities, etc. so that it can move cooperatively with male tool 110.

In station two 204, the fabricated tooling for the adhesive application fixture 220, is shown in FIGS. 11–13 as a fixture similar to the female shaping tool, which would transfer a typically liquid adhesive activator, or liquid adhesive to the first and second shaped foil parts 270, 272. The liquid would travel from a industry common dispenser (not shown) through tubing and fittings (not shown) to locations where it would be transferred through the fixture to the foil parts by a device such as a spray nozzle, or preferably a porous foam lining 274, and porous foam pads 276. The liquid dispenser would dispense the liquid to the porous foam lining on each assembly cycle, thus keeping the pads adequately supplied with the liquid so that a desired amount would transfer to the each foil part as it came into contact with the porous foam lining and pads.

After shaping of the foil parts 270, 272 the fabricating device 100 moves to station two 204. The first and second male shapes 112 and 114 are extended into the adhesive application fixture 220, where adhesive or other retention device is deposited onto the outside surfaces of both foil parts 270, 272 from contact with the porous foam features 274 and 276. The male tool forms 112 and 114 and are then retracted, and the male tool 110 is repositioned to position four 208, with the secondary foil part 272 in alignment with the plastic part 10.

In station four 208, fabricating the plastic part nest 280, requires the addition of any practical device to accurately locate and retain one or more plastic parts, such as the six locating pins 282 shown with plastic part 12 installed (FIG. 11). Additional retention such as clamps on the edges of the part (not shown) might be required.

The male shape tool 114 moves down fully into the plastic part 12, pressing the foil part surface against the plastic part surface. The conduit 170 (FIG. 10) would be briefly connected to a positive pressure source 190, to press the teeth features 56 of secondary foil part 272 onto the cylindrical wall surface 28 of plastic part 12. Gripping conduits 178 would -also be connected to a positive pressure source 190, releasing their grip on the foil part 272, and forcing air between the male tool surfaces and the foil part 272. Then conduit 170 would be switched back (connected to low pressure source 192) to contract the male tool surface away from the foil part surface, and the tool withdrawn, leaving the secondary foil part 272 installed into the plastic part 12.

Then repositioning the male tool 110 again aligns the first foil part 270 with the plastic part 12 (already containing the secondary foil part 272). The male tool 110 extends down so the first male tool shape 112 moves fully into the plastic part 12 until the foil part surface is seated against the floor surface 18 of the plastic part 12. Then the conduits 170 would be briefly connected to positive pressure source 190 to seat the first foil part 270 surfaces onto the plastic part 12 surfaces and tabs 52 onto the overlapping the teeth 56 (see FIG. 3). The gripping conduits 174, and 178 would release, by connecting to the high-pressure source 190, and connecting conduits 170 to low pressure source 192, the male tool 110 is contracted. The tool is then withdrawn from the part, leaving the first foil part 270 installed into the plastic part 12. The male tool 110 would then return to position one 202. All of the desired surfaces of the plastic part 12 are now covered by the combination of both foil-parts 272 and 270 (FIG. 3) which includes some overlapping, primarily of the finger patterns 52 of the first foil part 270 over the teeth 56 of the secondary foil pattern 272 on the circular walls 28.

Thus two successive layers of shaped metal foil with some overlapping of the foil have cooperated to cover the inner surfaces of plastic part 12, providing EMI/RFI shielding that can be thinner, lighter, less costly, durable, and can be inexpensively applied at a plastics molding facility with automated equipment. Also, movement of the male tool 110 into the female tool 120 is preferred, but does not preclude moving the female tool onto the male tool instead.

Many variations upon this basic process are possible. For instance, although the second shaped foil 272 has been shown and described as being installed in the plastic part 12 prior to the first shaped foil 270 it is clear that the order of installation may be reversed while still maintaining the advantages of this invention.

The use of hollow conduits, their shape, and method of construction within the male tool shapes are exemplary only. In practice, several shapes of hollow conduits including a substantially hollow tool shape can be used. Other methods of creating hollow conduits, such as installing tubing into the tool casting can also be used. Furthermore, other techniques can also be used to create the desired lateral movements.

The shapes of both the foils and the interior surface of the plastic part shown in these figures are exemplary only. In practice a wide variety of shapes of varying degrees of complexity are expected and may require application of any number of individual layers of foils successively in order to achieve complete coverage.

There are several variations to the basic process described herein:

In some cases an interim step to add adhesive is not employed such that after the foil parts are shaped in position one 202, they are re-positioned at position four 208 and installed into the plastic part. In other cases the foil material could be directly shaped and installed into the plastic part in one process location 202, and in another extreme, two female shaping tools and two shaping steps may be required for one foil part. The spare position 206 could be utilized in this circumstance.

FIGS. 15A–H show details of an alternative embodiment in which it is desired to shape and install the foil material in one continuous movement. A single position equipment design (FIG. 15A–D) can be utilized. In this case, the plastic part 12 itself substitutes for the female tool. In FIGS. 15B–G, a shuttle assembly 298, with shuttle plate 300 containing the plastic part nest features, is mounted below the female outboard skirt 132, such that a plastic part 12 installed onto the shuttle plate 300 can be shuttled into the same place (FIGS. 15C, 15F) as the first female tool shape was previously located to receive the first foil pattern 254. This will be referred to as the first foil substation 306. It is then located in the same place (FIGS. 15D, 15G), as the secondary female tool shape was located to receive the secondary foil pattern 256 which will be designated as second foil substation 308. In this embodiment, an array of orifices or nozzles 302 are positioned to spray an adhesive activator, such as water, on to the underside of the foil patterns when the shuttle moves the plastic part 12 from the load position (FIGS. 15B, 15E), to the first foil substation 306 (FIGS. 15C, 15F), and then to the second foil substation 308 (FIGS. 15D, 15G). Utilizing a pre-applied and dried adhesive on the foil, this method would activate the adhesive just prior to installing the foil part into the plastic part. The male tool shapes 112 and 114 would be activated sequentially, as the plastic part 12 is positioned by individual actuators 294, 296 (FIG. 15B). The enlarged view FIG. 15H, shows where rollers 304 are added to the female outboard skirt 132. As the foil pattern 254 is advanced downward by the male shape tool 112, the external rectangular panels 38, 40 and 42 would be shaped by the rollers as the male shape tool 112, with the foil pattern 254 gripped thereon, passed through the opening described by the inside surfaces of the rollers 304. This pre-shaping of the exterior surfaces of the foil part enables the activation of the additional gripping circuit 178 (FIG. 10), and subsequently, the activation of the contraction conduit 170 which then contracts the shaped foil part prior to installing the foil part into the plastic part.

Figure 16:
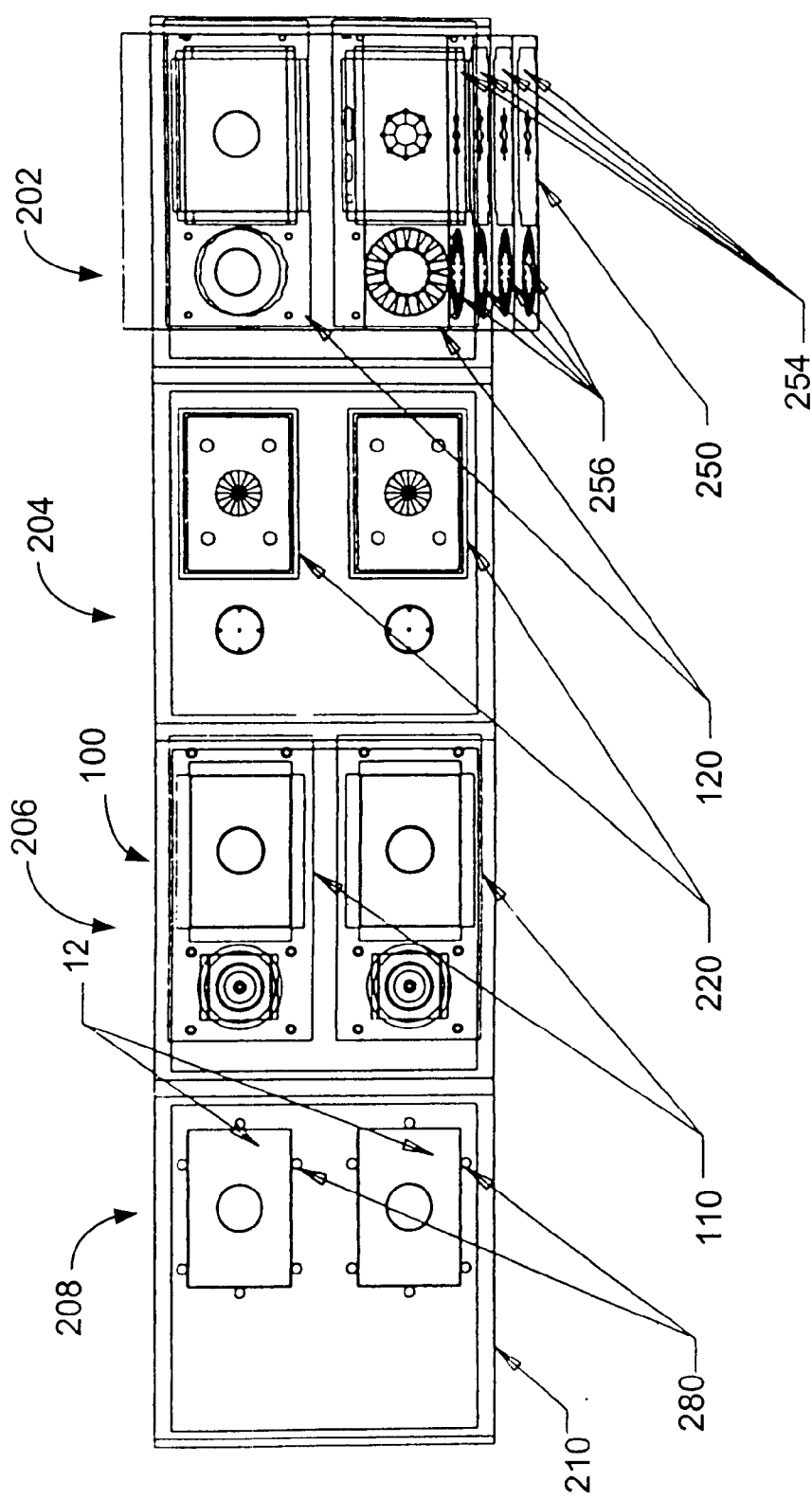
FIG. 16 is an overhead plan view of a multi-station embodiment showing multiple instances of all tooling.

It is a further option to process multiple parts simultaneously, by providing multiple instances of the foil patterns along with multiple instances of the other required tooling as illustrated in FIG. 16. The fabricating device 100 containing two male shaping tools 110 are shown in station three 206 for ease of viewing. Two plastic parts 12 can be seen in station four 208, each in a nest 280. Two adhesive application fixtures 220 can be seen in station two 204, and a foil roll 250 with two sets of first and second foil patterns 254, 256 can be seen positioned over two female shaping tools 120 in station one. Of course the number of multiples possible is not limited to the two shown.

FIGS. 17 and 18 show the general steps involved in the development of a system for producing EMI/RFI shielded parts. There are involved two cooperating processes. The steps of the first process are set forth in FIG. 17, beginning with design and reproduction of the flat patterns in foil material, along with the design and fabrication of custom tooling for installing the foil patterns into the production part. The second is the actual installation of successive layers of shaped foil into the plastic part set forth in FIG. 18. FIG. 17 describes the general steps of fabrication. FIG. 18 describes an alternate method which utilizes the same first processing steps 1700–1750 but with the female tool 120 removed and the adhesive application fixture 220 replaced with a spray system providing an adhesive activator.

It is yet another option to fully automate this method by integrating a continuous supply of plastic parts, by conveyor for example, and providing a device to position the next part, and eject the finished part. These added requirements could be readily accommodated by using the male tool capabilities to grip parts, or redesigning the part positioning nest to cooperate with a conveyor feed.

Although the above describes adhesive being dispensed onto the foil parts, other retention methods are equally preferred. It is, for example, practical to dispense adhesive onto the flat patterns that will dry before the patterns are rolled or otherwise repackaged, or to buy the foil material with a coating of dried adhesive thereon. In these cases, dispensing an adhesive activator, not the adhesive, would be substituted.

Although exemplary embodiments of the present invention have been shown and described, it will be apparent to those having ordinary skill in the art that a number of changes, modifications, or alterations to the invention as described herein may be made, none of which depart from the spirit of the present invention. For example, this method described in a linear sequence is also commonly arranged with a rotary index drive such that the repositioning of the male tool with: the female tool; the retention device fixture; and the part nest fixture is accomplished rotationally. All such changes, modifications and alterations should therefore be seen as within the scope of the present invention.

Accordingly, the above disclosure is not to be considered as limiting and the appended claims are to be interpreted as encompassing the true spirit and the entire scope of the invention.

INDUSTRIAL APPLICABILITY

The present EMI/RFI shield 10 is well suited for application in electronic equipment such as computers, printers, cellular phones, and most other products that require surrounding shielding to block electromagnetic interference/radio frequency interference (EMI/RFI). Various components and circuits of electronic equipment are capable of emitting electromagnetic radiation at a variety of frequencies. In developed countries, governmental agencies have set maximal acceptable limits for EMI/RFI radiation. Shielding 10 as produced by the present invention can be very valuable to manufacturers who must comply with these acceptable limits.

In addition, external sources of EMI/RFI radiation can interfere with the functioning of sensitive electronic parts within such devices. Thus, EMI/RFI containment is necessary in order for these devices to perform to commercially acceptable standards. Although some progress in containing the emissions is made by adjustments to the circuits themselves, the requirement for, and use of, grounded conductive surfaces, generally involving the product's normal interior enclosure surfaces, is nearly universal. By providing efficient shielding 10 at reduced cost, the overall cost of manufacture is greatly reduced. When considering how many devices are manufactured each year that require such shielding, any reduction in cost and/or time involved in manufacture will present a major savings to the electronics industry.

Grounded conductive interior case surfaces or added shields also provide the electronics contained within protection against electro-static discharge. The same shielding 10 that protects against EMI can serve to provide a grounding path which can protect devices from this electro-static discharge. Components that are susceptible to damage from this discharge are often complex and therefore costly to replace. The shielding 10 of the present invention can thus provide major savings to manufacturers or consumers who are spared the replacement costs of these sensitive components.

Prior devices and processes have provided EMI/RFI shielding, but these produce some problems of several sorts. Components that are coated with sprays of conductive material can produce loose conductive particles that can short circuits. In addition, limited connections within the particle matrix can inhibit high frequency energy flow. There can also be poor uniformity of coating particles due to variations in coating thickness or conductive particle density, or inadequate deposition in deep cavities.

Another problem is the cost, and the handling involved to pack and transport the plastic parts to a painting or plating facility to receive the coating. Also, one of the major concerns for plating and spray coating processes is both air and water environmental pollution with the metal particles and/or solvents involved in coating application.

The present invention solves these problems by producing highly reliable, very uniform shielding which requires no special plating facilities to install. Since the conductive layer is in the form of one or more layers, which are mechanically applied, there are no chemical processes involved, and no exposure to toxins and solvents that are generally found in plating operations.

The entire operation is easily automated, thus reducing labor costs and since the foil layers can be made very thin, and applied very uniformly, the material necessary to produce a shield 10 can be very much reduced, with accompanying cost reduction. In addition, the system of fabrication 200 can be used with metal foil of such thinness that handling and manipulation by human hands may be difficult or even impossible.

For the above, and other, reasons, it is expected that the shield 10, process and system of manufacture of the present invention will have widespread industrial applicability. Therefore, it is expected that the commercial utility of the present invention will be extensive and long lasting.

What is claimed is:

1. An EMI/RFI shield, using very thin conductive film for attachment to a plastic part, prepared by a process comprising the steps of:

A) creating a two dimensional representation of a surface of a plastic part which is to be shielded;

B) creating at least one pattern corresponding to a portion of said representation of said surface to be shielded;

C) incising said at least one pattern into conductive foil material to create at least one foil pattern part;

D) detaching said at least one foil pattern part from surrounding foil material;

E) shaping said at least one foil pattern part into at least one shaped foil part; and F) attaching said at least one shaped foil part to said plastic part by use of an expandable fabricating device, which during expansion acts to press said shaped foil part to said plastic part.

2. An EMI/RFI shield as in claim 1 wherein;
said expandable fabricating device in process step F) includes mechanisms which are selected from the group consisting of pneumatically operated devices, solenoid operated devices, mechanical linkages, hydraulically operated devices and material which expands in lateral directions when vertically compressed.

3. An EMI/RFI shield as in claim 1 wherein;
said expandable fabricating device in process step F) includes at least one expandable male tool.

4. An EMI/RFI shield as in claim 1 wherein;
said expandable fabricating device in process step F) includes at least one expandable female tool.

5. An EMI/RFI shield as in claim 1 wherein;
said expandable fabricating device in process step F) includes at least one gripping conduit, which is supplied with air at less than atmospheric pressure, by which foil and shaped foil parts can be gripped and transported.

6. An EMI/RFI shield as in claim 1 wherein;
said expandable fabricating device in process step F) includes at least one shaping means, by which the shaping of said at least one foil pattern into said at least one shaped part in process step E) may be performed.

7. An EMI/RFI shield as in claim 6 wherein;
said shaping means is a male shaping tool which cooperates with an element chosen from the group consisting of a female shaping tool, rollers on a female tool skirt, and a representative plastic part.

8. An EMI/RFI shield as in claim 1 wherein;
said expandable fabricating device in process step F) includes at least one detaching means, by which the detaching said of said foil pattern part from surrounding foil material in process step D) may be performed.

9. An EMI/RFI shield as in claim 1 wherein;
said foil material is provided in a roll, which is automatically provided to said detachment means.

10. An EMI/RFI shield as in claim 1 wherein process step F) includes:
1) applying an adhesive to surfaces of said shaped foil part;
2) positioning said shaped foil part in proper relation with said plastic part; and
3) activating said expandable fabricating device so that said shaped foil part is pressed into contact with said plastic part.

11. An EMI/RFI shield as in claim 1 wherein;
said expandable fabricating device is movable to multiple stations to conduct processing steps at each of said multiple stations.

12. An EMI/RFI shield as in claim 1 wherein;
said expandable fabricating device is stationary and a shuttle device is provided to move parts to said stationary expandable fabricating device for processing.

13. An EMI/RFI shield as in claim 1 wherein:
said expandable fabricating device in process step F) includes at least one shaping tool including a gripping device which grips a foil pattern part upon which adhesive has been applied and which engages a production plastic part and expands, thus shaping the foil pattern part and attaching it to said production plastic part in one combined step, after which the expandable fabricating device releases the shaped foil part, contracts and withdraws from the plastic part.

14. An apparatus for installing thin metallic film shielding in plastic parts to create EMI/RFI shields, comprising:
an expandable fabricating device, which is expandable by activation of at least one mechanism which is selected from the group consisting of pneumatically operated devices, solenoid operated devices, hydraulically operated devices and material with expands in lateral directions when vertically compressed, where said expandable fabricating device includes at least one expandable male tool.

15. An apparatus as in claim 14 wherein;
said expandable fabricating device includes at least one expandable female tool.

16. An apparatus as in claim 14 wherein;
said expandable fabricating device is segmented to enhance lateral movement of the device.

17. An apparatus as in claim 14 wherein;
said expandable fabricating device includes stiffening elements to control directionality of expansion.

18. An apparatus as in claim 14 wherein;
said expandable fabricating device includes at least one gripping conduit, which is supplied with air at less than atmospheric pressure, by which foil and shaped foil parts can be gripped and transported.

19. An apparatus as in claim 14 wherein;
said expandable fabricating device includes at least one shaping means, by which the shaping of said at least one foil pattern into said at least one shaped part may be performed.

20. An apparatus as in claim 19 wherein;
said shaping means is a male shaping tool which cooperates with an element chosen from the group consisting of a female shaping tool, rollers on a female tool skirt, and a representative plastic part.

21. An apparatus as in claim 14 wherein;
said expandable fabricating device,includes at least one detaching means, by which the detaching said of a foil pattern part from surrounding foil material may be performed.

22. An apparatus as in claim 14 wherein;
said expandable fabricating device is movable to multiple stations to conduct processing steps at each of said multiple stations.

23. An apparatus as in claim 14 wherein;
said expandable fabricating device is stationary and a shuttle device is provided to move parts to said stationary expandable fabricating device for processing.

24. An apparatus as in claim 14 wherein;
said expandable fabricating device cooperates with an automated foil dispensing device which automatically positions foil parts for processing by said expandable fabricating device.

25. An apparatus as in claim 14 wherein;
said expandable fabricating device cooperates with an adhesive dispensing device, which applies adhesive to at least one surface of said shaped foil parts before said expandable fabricating device presses said shaped foil parts to said plastic parts.

26. A method of manufacturing an EMI/RFI shield having a very thin conductive film attached to a plastic part, comprising the steps of:
   A) creating a two dimensional representation of a surface of a plastic part which is to be shielded;
   B) creating at least one foil pattern part corresponding to a portion of said representation of said surface to be shielded;
   C) positioning said at least one foil pattern part and said plastic part for processing;
   D) shaping said at least one foil pattern part into at least one shaped foil part; and
   E) attaching said at least one shaped foil part to said plastic part by use of an expandable fabricating device, which during expansion acts to press said shaped foil part to said plastic part.

27. A method of manufacturing as in claim 26 wherein process step B) includes:
   1) incising said at least one pattern repeatedly in a continuous roll of conductive foil material to create a plurality of foil pattern parts; and
   2) detaching each of said plurality of foil pattern part from the continuous roll.

28. A method of manufacturing as in claim 26 wherein process step C) includes:
   1) gripping said at least one foil pattern part by a gripping device included on said expanding fabricating device of step E; and
   2) transporting said at least one foil pattern part to a processing location.

29. A method of manufacturing as in claim 26 wherein process step D) includes:
   1) providing a male shaping tool which cooperates with an element chosen from the group consisting of a female shaping tool, a representative part, or rollers on a female tool skirt.

30. A method of manufacturing as in claim 26 wherein process step E) includes:
   1) applying an adhesive to surfaces of said shaped foil part;
   2) positioning said shaped foil part in proper relation with said plastic part; and
   3) activating said expandable fabricating device so that said shaped foil part is pressed into contact with said plastic part.

31. A method of manufacturing as in claim 26 wherein process step E) includes:
   1) activating a dried adhesive which has been pre-applied to surfaces of said shaped foil part;
   2) positioning said shaped foil part in proper relation with said plastic part; and
   3) activating said expandable fabricating device so that said shaped foil part is pressed into contact with said plastic part.

32. A method of manufacturing as in claim 26 wherein said expandable fabricating device includes said gripping device, comprising the further step of:
   F) disengaging said expandable fabricating device by releasing said gripping device, contracting said expandable fabricating device and withdrawing from contact with said shaped foil part.

33. A method of manufacturing as in claim 26 wherein: said expandable fabricating device is movable to multiple stations to conduct processing steps at each of said multiple stations.

34. A method of manufacturing as in claim 26 wherein: said expandable fabricating device is stationary and a shuttle device is provided to move parts to said stationary expandable fabricating device for processing.

35. A method of manufacturing as in claim 26 wherein: said expandable fabricating device is at least one shaping tool including a gripping device which grips a foil pattern part upon which adhesive has been applied and which engages a production plastic part and expands, thus shaping the foil pattern part and attaching it to said production plastic part in one combined step, after which the expandable fabricating device releases the shaped foil part, contracts and withdraws from the plastic part.

* * * * *